United States Patent
Reuven et al.

(10) Patent No.: US 6,751,255 B1
(45) Date of Patent: Jun. 15, 2004

(54) DECISION FEEDBACK ANALYZER WITH FILTER COMPENSATION

(75) Inventors: Ilan Reuven, Ramat Gan (IL); Ayelet Shahar Doron, Modi'in (IL)

(73) Assignee: Orckit Communications, Ltd., Tel Aviv (IL)

( * ) Notice: Subject to any disclaimer, the term of this patent is extended or adjusted under 35 U.S.C. 154(b) by 0 days.

(21) Appl. No.: 09/521,495

(22) Filed: Mar. 9, 2000

(51) Int. Cl.[7] .................. H03H 7/30; H03H 7/40; H03K 5/159
(52) U.S. Cl. .................. 375/233; 375/230; 375/232
(58) Field of Search .................. 375/229, 285, 375/233, 232, 214, 230; 348/607

(56) References Cited

U.S. PATENT DOCUMENTS

| | | |
|---|---|---|
| 3,665,171 A | 5/1972 | Morrow |
| 5,249,200 A | 9/1993 | Chen et al. |
| 5,293,402 A | 3/1994 | Crespo et al. |
| 5,420,884 A | 5/1995 | Inoue |
| 6,404,810 B1 | 6/2002 | Girardeau, Jr. et al. |
| 6,430,287 B1 | 8/2002 | Rao |

*Primary Examiner*—Stephen Chin
*Assistant Examiner*—Curtis Odom
(74) *Attorney, Agent, or Firm*—Darby & Darby (57) ABSTRACT

A digital data receiver, for receiving a signal that is transmitted over a channel having a channel response and is filtered with a predetermined filter response. The receiver includes a decision device, coupled to receive a sequence of equalized samples and to generate, responsive thereto, a corresponding sequence of estimated symbols. A feed-forward equalizer receives a sequence of input samples of the signal and generates responsive to the input samples, forward-equalized samples. A decision feedback equalizer (DFE), which receives the sequence of estimated symbols, includes an adaptive element, which processes the estimated symbols responsive to the channel response, and a fixed element, which processes the estimated symbols responsive to the predetermined filter response. The DFE generates feedback-equalized samples by combined operation of the adaptive and fixed elements. An adder combines the forward-equalized samples with the feedback-equalized samples so as to provide the equalized samples to the decision device.

23 Claims, 4 Drawing Sheets

DECISION FEEDBACK ANALYZER WITH FILTER COMPENSATION

FIELD OF THE INVENTION

The present invention relates generally to data communication devices, and specifically to adaptive digital data receivers.

BACKGROUND OF THE INVENTION

Decision feedback equalizers (DFEs) are commonly used in digital data receivers. The DFE operates in conjunction with a decision device, such as a slicer, which estimates an output symbol value for each sample of a signal that it receives. The DFE provides feedback to the decision device based on prior decisions (i.e., symbols already estimated), with the purpose of canceling the effect of postcursor intersymbol interference in the current decision. For this purpose, the DFE typically comprises a multi-tap finite impulse response (FIR) filter, which receives as its input the sequence of symbols estimated by the decision device. The coefficients of the filter are generally determined adaptively, based on the characteristics of the channel through which the signal is received. The output of the DFE is then subtracted from the input of the decision device.

A comprehensive discussion of decision feedback equalizers is presented, for example, by Gitlin et al., in *Data Communications Principles* (Plenum Press, 1992), which is incorporated herein by reference. (See particularly pages 500–511.) Methods of filter adaptation are described, for example, by Haykin in *Adaptive Filter Theory* (3rd edition, Prentice Hall, 1996), which is also incorporated herein by reference.

It is also possible to use an infinite impulse response (IIR) filter in the DFE, as described, for example, by Crespo, in "Pole-Zero Decision Feedback Analyzer with a Rapidly Converging Adaptive IIR Algorithm," published in *IEEE Journal on Selected Areas in Communications* 9(6) (August, 1991), pages 817–828, which is incorporated herein by reference. The author describes a DFE containing a feedback filter composed of two sections: a relatively short FIR that cancels the initial part of the channel impulse response, and an IIR filter that cancels the smoothly decaying tail of the impulse response. This DFE offers a reduction in mean squared error relative to a conventional DFE having the same number of coefficients, with a comparable speed of convergence.

SUMMARY OF THE INVENTION

It is an object of the present invention to provide improved devices and methods for digital feedback equalization.

It is a further object of some aspects of the present invention to provide devices and methods for compensating for intersymbol interference effects that occur due to filtering of a signal transmitted over a channel, particularly due to notch filtering.

In preferred embodiments of the present invention, a digital filter with a known filter response is applied to a signal that is transmitted over a channel to a digital data receiver. Typically, the digital filter comprises a notch filter, which is preferably used in a transmitter to shape the signal that is transmitted to the receiver, or is alternatively used in the receiver to filter out narrowband interference. The receiver comprises a DFE having two parts: an adaptive part, which compensates for variable intersymbol interference effects, typically arising due to distortion in the channel; and a fixed part, which compensates for the intersymbol interference caused by the digital filter. Both the adaptive and fixed parts comprise multi-tap filters.

By separating the fixed and adaptive parts of the DFE, the length of the adaptive part of the DFE is reduced, relative to the number of taps that would be needed to achieve comparable performance in a conventional DFE with only a single (all adaptive) part. The DFE of the present invention thus converges more rapidly to the desired response than the conventional DFE would be able to do under these circumstances. Essentially, the fixed part of the DFE nullifies any system performance penalty that might otherwise result from the use of the digital filter, as long as the receiver also includes a feed-forward equalizer long enough to cancel signal precursors. Furthermore, regardless of whether the digital filter has a finite impulse response (FIR) or an infinite impulse response (IIR) structure, the DFE of the present invention is capable of compensating for its effect by using a FIR or IIR accordingly in the fixed part of the DFE.

There is therefore provided, in accordance with a preferred embodiment of the present invention, a digital data receiver, for receiving a signal that is transmitted over a channel having a channel response and is filtered with a predetermined filter response, the receiver including:

a decision device, coupled to receive a sequence of equalized samples and to generate, responsive thereto, a corresponding sequence of estimated symbols;

a feed-forward equalizer, coupled to receive a sequence of input samples of the signal and to generate, responsive to the input samples, forward-equalized samples;

a decision feedback equalizer (DFE), coupled to receive the sequence of estimated symbols, and including:

an adaptive element, operative to process the estimated symbols responsive to the channel response; and         a fixed element, operative to process the estimated symbols responsive to the predetermined filter response, the DFE generating feedback-equalized samples by combined operation of the adaptive and fixed elements; and         an adder, coupled to combine the forward-equalized samples with the feedback-equalized samples so as to provide the equalized samples to the decision device.

Preferably, the receiver includes a filter, which is coupled to apply the predetermined filter response to the signal received from the channel. Alternatively, the predetermined filter response is applied by a transmitter, which transmits the signal over the channel.

In a preferred embodiment, the predetermined filter response includes a notch filter response. In another preferred embodiment, the predetermined filter response is applied by a digital filter having an infinite impulse response, and the fixed element of the DFE includes an infinite impulse response filter element.

Preferably, the adaptive element includes:

a decision feedback filter having adaptive coefficients; and     an adaptation circuit, operative to determine the adaptive coefficients responsive to the predetermined filter response, most preferably using a least-mean-square method and based on filtering the estimated symbols using the predetermined filter response.

Preferably, the predetermined filter response is described by a frequency response $F(z)$, and the fixed element of the DFE includes:

a first fixed element, having a frequency response substantially equal to F(z), which operates on the estimated symbols in conjunction with the adaptive element to generate a first output; and a second fixed element, having a frequency response substantially equal to $(F(z)-1)/z^{-1}$, which operates on the estimated symbols to generate a second output, wherein the DFE includes an adder, which sums the first and second outputs to generate the feedback-equalized samples.

In a preferred embodiment, the adaptive element includes a decision feedback filter having adaptive coefficients, which are determined responsive to the channel response in an initial stage of operation of receiving the signal from a transmitter, wherein in a subsequent stage of receiving the signal, the adaptive coefficients are conveyed to a precoder in the transmitter that is operative to precode the signal using the coefficients. Preferably, in the subsequent stage of receiving the signal, the adaptive element of the DFE is substantially inoperative, while the fixed element continues to process the estimated symbols responsive to the predetermined filter response.

There is also provided, in accordance with a preferred embodiment of the present invention, a method for decision feedback equalization, including:

generating a sequence of estimated symbols based on a corresponding sequence of equalized samples, which are derived from a signal that is transmitted over a channel having a channel response and is filtered with a predetermined filter response;

processing the estimated symbols with adaptive processing parameters responsive to the channel response so as to generate adaptive feedback samples;

processing the estimated symbols with fixed processing parameters responsive to the predetermined filter response so as to generate fixed feedback samples; and combining the adaptive feedback samples with the fixed feedback samples so as to generate feedback-equalized samples, for use in deriving the equalized samples.

The present invention will be more fully understood from the following detailed description of the preferred embodiments thereof, taken together with the drawings in which:

DETAILED DESCRIPTION OF A PREFERRED EMBODIMENT

Figure 1:
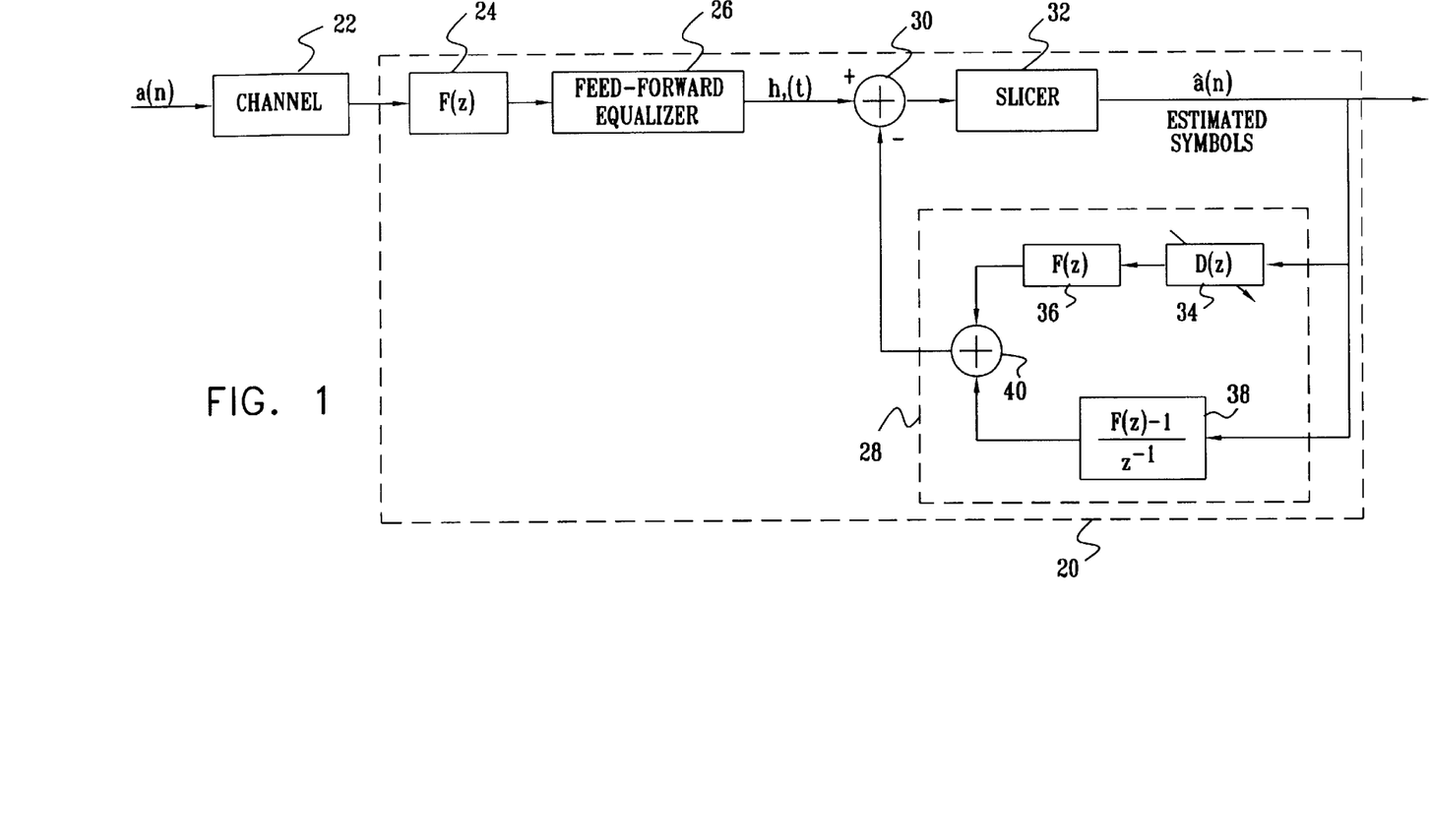
FIG. 1 is a schematic block diagram illustrating elements of a digital data receiver that includes a DFE, in accordance with a preferred embodiment of the present invention.

FIG. 1 is a schematic block diagram illustrating a digital data receiver 20, in accordance with a preferred embodiment of the present invention. A signal comprising a stream of symbols a(n) is transmitted over a channel 22 by a transmitter (not shown). A digital filter 24, having a response F(z), is applied to the transmitted signal. The transmitter may also apply a shaping filter to the transmitted signal, whose response is considered to be included in the channel response. Receiver 20 also comprises an analog front end, as is known in the art, which preprocesses, samples and digitizes the signals received over channel 22. The front end, as well as other ancillary circuitry not of particular relevance to the present invention, is omitted from the figures for the sake of clarity of illustration.

Typically, filter 24 comprises a notch filter, used in receiver 20 to eliminate narrowband interference picked up on channel 22, which frequently occurs due to radio transmissions, for example. Alternatively, filter 24 may be located in the transmitter for further shaping the power spectral density of the transmitted signal. (In this case, the order of channel 22 and filter 24 should be reversed.) Such notch filters are used, for example, in Very High Speed Digital Subscriber Line (VDSL) transmitters in order to prevent radio frequency emissions in certain frequency bands that are used for amateur radio transmission and public radio broadcasts. Notch filters are thus of particular concern in this preferred embodiment because they must commonly be used in Digital Subscriber Line (DSL) systems, and because their use engenders intersymbol interference. The present invention is equally applicable, however, with respect to substantially any type of digital filtering that may be implemented by filter 24, either in the transmitter or in receiver 20.

A feed-forward equalizer (FFE) 26 receives the digitized samples of the signal and outputs forward-equalized samples to an adder 30. The adder combines the forward-equalized samples with decision-feedback samples provided by a DFE 28. The structure of the DFE is described hereinbelow. A slicer 32 receives equalized samples output by adder 30 and generates a stream of output symbols, representing an estimate of the input symbols a(n) sent by the transmitter.

To explain the structure of DFE 28, let h(t) be the impulse response of channel 22 together with FFE 26, and let $H^+(z)$ represent the frequency response of the causal part of h(t), i.e., the cursor and postcursors, at the output of FFE 26. The frequency transfer function of DFE 28, D(z), that is required to equalize $H^+(z)$ (ignoring for the moment the effect of filter 24) is given by:

$$D(z) = \frac{H^+(z) - 1}{z^{-1}}$$

Thus, $H^+(z) = D(z) \cdot z^{-1} + 1$.

When the filter with response F(z) is added to the channel, the combined impulse response $h_1(t)$ has a causal part whose frequency response $H_1^+(z)$ is given by $H_1^+(z) = H^+(z) \cdot F(z)$ (since any implementable digital filter has a causal response). In order to compensate for both the channel and filter responses, the DFE must now have a frequency transfer function given by:

$$D_1(z) = \frac{H_1^+(z) - 1}{z^{-1}}$$

$$= \frac{H^+(z) \cdot F(z) - 1}{z^{-1}}$$

$$= \frac{(D(z) \cdot z^{-1} + 1) \cdot F(z) - 1}{z^{-1}}$$

$$= D(z) \cdot F(z) + \frac{F(z) - 1}{z^{-1}}$$

This convenient decomposition of the filter response is implemented in DFE 28, shown in FIG. 1. The first term in $D_1(z)$, $D(z) \cdot F(z)$, is implemented by an adaptive block 34 with response $D(z)$ and a fixed block 36 with response $F(z)$, i.e., with a fixed response identical to that of filter 24. The second term is implemented by a block 38 with fixed response $$\frac{F(z)-1}{z^{-1}}.$$

Thus, only block 34 should have adaptive filter coefficients. These adaptive coefficients correspond only to the response of channel 22, substantially irrespective of filter 24 (as long as FFE 26 has sufficient taps to compensate substantially totally for precursor interference). The outputs of blocks 36 and 38 are summed by an adder 40.

Preferably, adaptive block 34 include adaptive filter, whose coefficients may vary during operation of transceiver 20 based on an error signal $e(n)$, generated by subtracting the equalized symbols input to slicer 32 from the estimated symbols $\hat{a}(n)$ at the slicer output. The error signal is input to an adaptation circuit, which calculates the adaptive coefficients to be applied by an adaptive equalization filter. The adaptation circuit also receives as an input the estimated symbols $\hat{a}(n)$.

The adaptation circuit preferably uses a least-mean-square (LMS) algorithm, as described, for example, in the above-mentioned book by Haykin, on pages 365–372. In a conventional DFE using LMS adaptation, each filter coefficient $d_k(n)$ (representing the k-th coefficient of equalizer response $D(z)$ at time n) is given by the iterative formula $d_k(n+1)=d_k(n)+\gamma \cdot e(n) \cdot \hat{a}_k^*(n)$. Here $\gamma$ is an adaptation factor, which controls the rate of convergence of the filter, and $\hat{a}_k^*(n)$ is the complex conjugate of $\hat{a}_k(n)$, which is the estimated symbol at the input of the k-th tap of the filter. In DFE 28, however, this formula is altered on account of the need to compensate for the effect of filter 24, as well, so that:

$$d_k(n+1)=d_k(n)+\gamma \cdot e(n) \cdot b_k^*(n)$$

Here the sequence $b(n)$ is the convolution of the sequence of estimated symbols $\hat{a}(n)$ with $f(n)$, which is the impulse response of $F(z)$.

Figure 2:
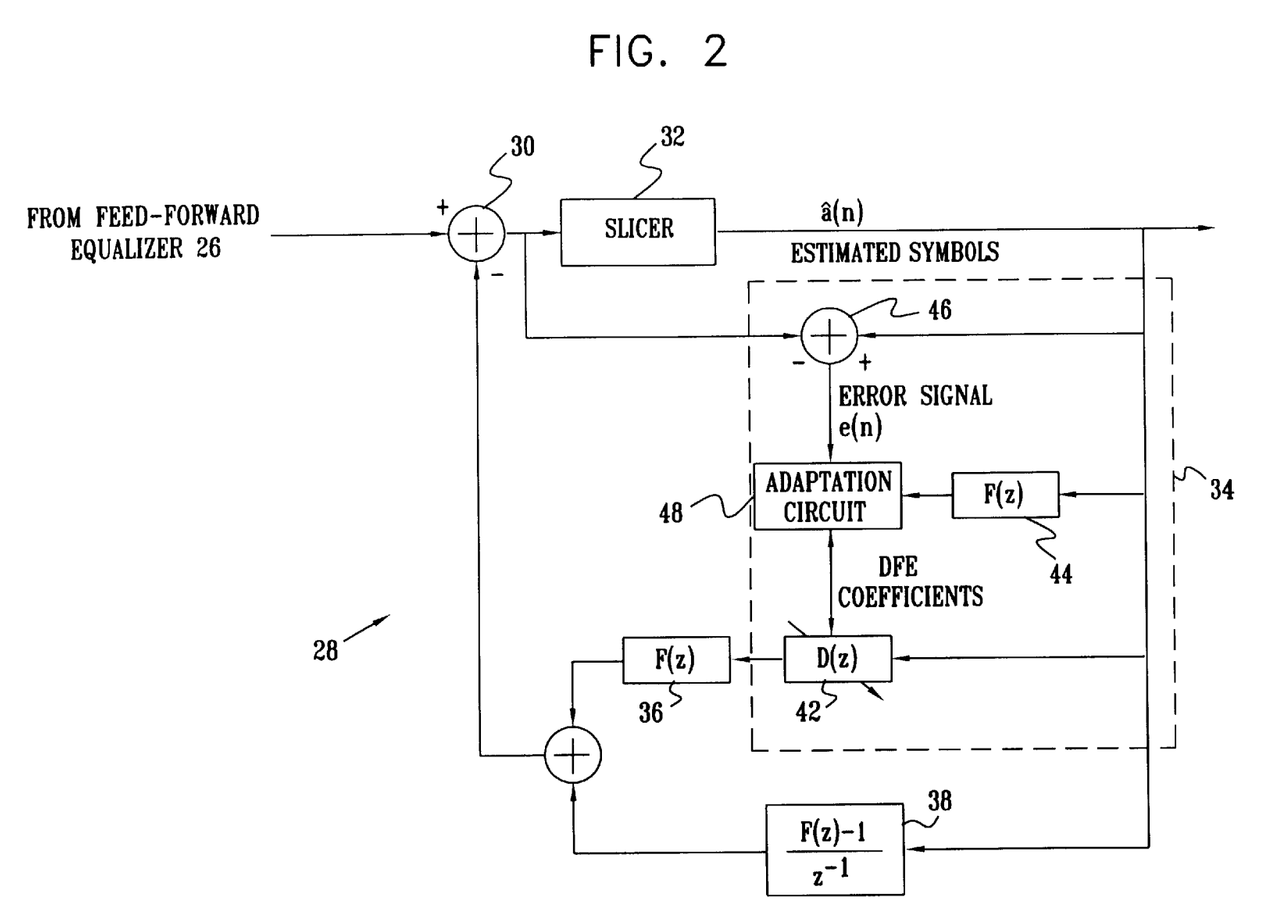
FIG. 2 is a schematic block diagram showing details of the DFE of FIG. 1, in accordance with a preferred embodiment of the present invention.

FIG. 2 is a schematic block diagram showing details of DFE 28, and particularly of adaptive block 34, in accordance with a preferred embodiment of the present invention. The error signal $e(n)$ is generated by an adder 46, which subtracts the equalized symbols input to slicer 32 from the estimated symbols $\hat{a}(n)$ at the slicer output. The error signal is input to an adaptation circuit 48, which calculates the adaptive coefficients to be applied by an adaptive equalization filter 42. For the purpose of creating $b(n)$, the estimated symbols $\hat{a}(n)$ are filtered in a filtering block 44, with the same filter response $F(z)$ as filter 24. Adaptation circuit 48 then operates according to the normal LMS adaptation model, but with $b(n)$ instead of $\hat{a}(n)$ as its input.

Figure 3:
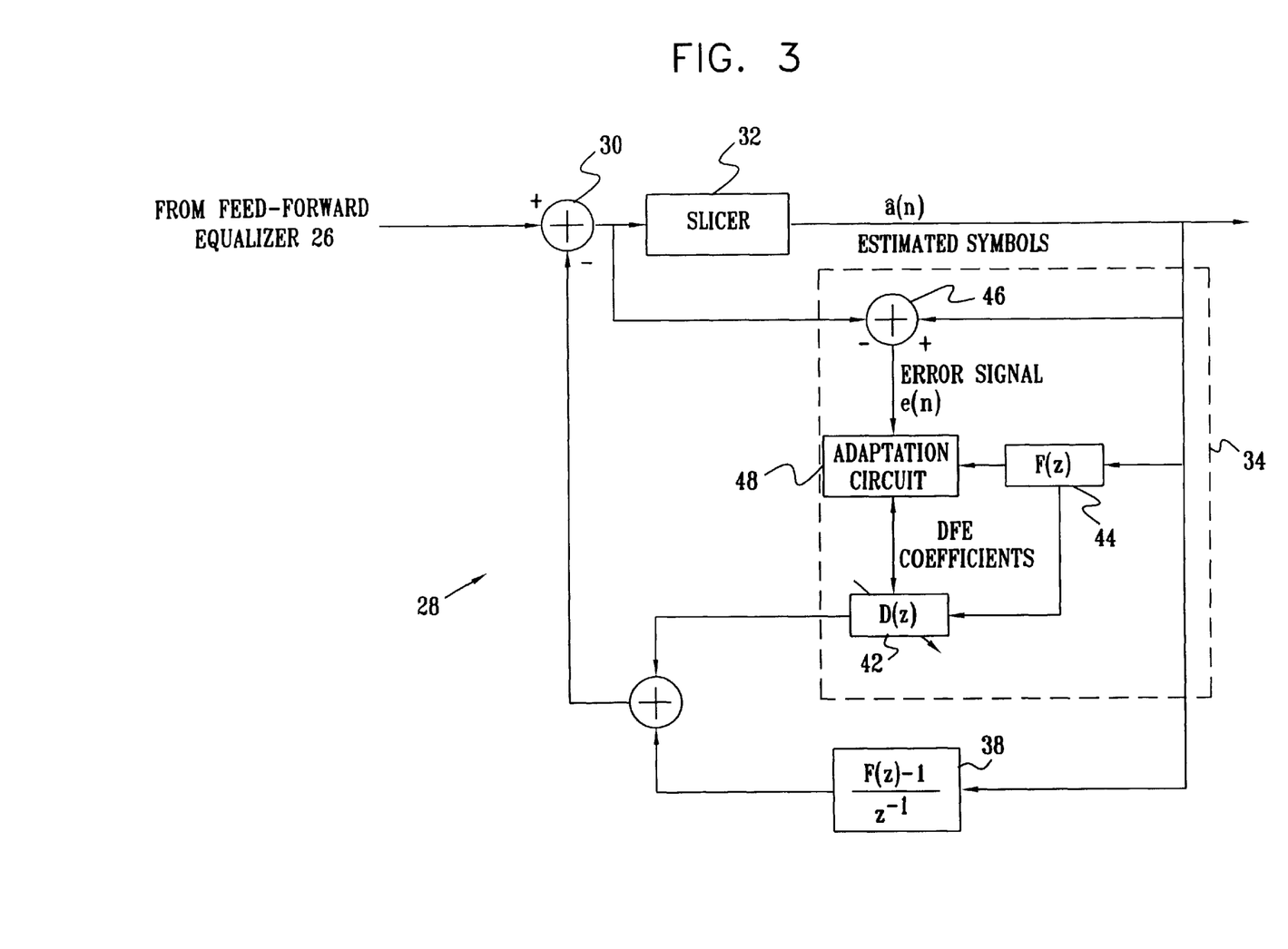
FIG. 3 is a schematic block diagram showing details of a DFE, in accordance with another preferred embodiment of the present invention.

FIG. 3 is a schematic block diagram illustrating DFE 28 in accordance with an alternative embodiment of the preferred embodiment. This embodiment is substantially similar to that shown in FIG. 2, except that in FIG. 3, the order of operation of the fixed filter block with response $F(z)$ and adaptive equalization filter 42 is reversed. In this case, $b(n)$ is the output of filter 44 which is used as input for both adaptation circuit 48 and adaptive filter 42. Consequently, block 36 is eliminated from the embodiment of FIG. 3, and filtering block 44 takes its place, so that one less filter is required for implementation of the DFE.

On the other hand, in the embodiment of FIG. 2, filter 42 is fed with estimated symbols that can be represented using a relatively small number of bits per symbol. Thus, $D(z)$ can be implemented using multipliers with only a small number of input bits, providing substantial hardware savings when filter 42 comprises a long FIR filter.

The structure of DFE 28 generally provides superior equalization, with reduced convergence and adaptation time, relative to conventional DFEs in which the adaptive and fixed portions are not separated. $F(z)$ may comprise substantially any filter response that can be expressed by the general formula:

$$F(z) = \frac{b_0 + b_1 z^{-1} + b_2 z^{-2} + \ldots}{1 + a_1 z^{-1} + a_2 z^{-2} + \ldots}$$

This formula includes both FIR and IIR structures. The scheme described here is specifically applicable to filters $F(z)$ such that $b_0=1$, but the changes needed to incorporate filters with $b_0 \neq 1$ will be apparent to those skilled in the art.

Figure 4:
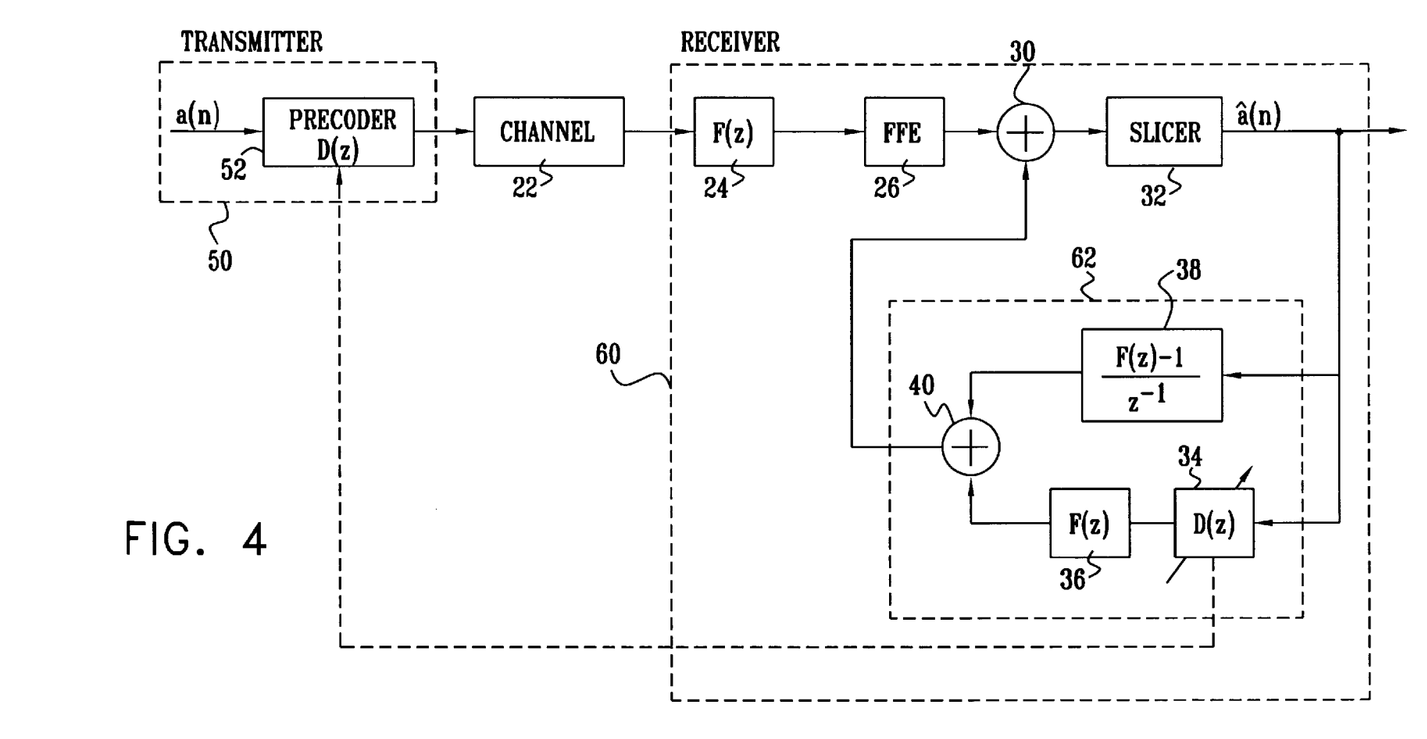
FIG. 4 is a schematic block diagram illustrating elements of a digital communication system, in accordance with yet another preferred embodiment of the present invention.

FIG. 4 is a block diagram that schematically illustrates a digital communication system comprising a transmitter 50 and a receiver 60, in accordance with another preferred embodiment of the present invention. Transmitter 50 comprises a precoder 52, preferably a Tomlinson-Harashima precoder, as is known in the art. Such precoders are described, for example, by Wei, in an article entitled, "Generalized Square and Hexagonal Constellations for Intersymbol-Interference Channels with Generalized Tomlinson-Harashima Precoders," published in *IEEE Transactions on Communications*, 42:9 (September, 1994), pp. 2713–2721, which is incorporated herein by reference. Further aspects of such precoders are described in U.S. Pat. No. 5,249,200, to Chen et al., whose disclosure is likewise incorporated herein by reference.

Receiver 60 is substantially similar to receiver 20 shown in FIG. 1. The receiver includes a DFE 62 that is similar to DFE 28 and adapts in like manner to the response of channel 22 in an initial stage of communications between transmitter 50 and receiver 60. Once the coefficients of adaptive block 34 have converged, however, these coefficients are preferably conveyed back to precoder 52, as shown by a dashed arrow in FIG. 4. The precoder uses these coefficients to precode symbols transmitted by transmitter 50 so as to substantially cancel the effect of channel 22, thereby obviating the need for the adaptive part of DFE 62. At this stage, therefore, adaptive block 34 is shut off (together with its companion filter 36), and the DFE compensates only for the fixed response of filter 24 by means of fixed filter block 38. Subsequently, the filter response $F(z)$ can be altered as needed, with concomitant adjustment of block 38 alone.

It will be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. A digital data receiver, for receiving a signal that is transmitted over a channel having a channel response and is filtered with a predetermined filter response, the receiver comprising:
   a decision device, coupled to receive a sequence of equalized samples and to generate, responsive thereto, a corresponding sequence of estimated symbols;
   a feed-forward equalizer, coupled to receive a sequence of input samples of the signal and to generate, responsive to the input samples, forward-equalized samples;

a decision feedback equalizer (DFE), coupled to receive the sequence of estimated symbols, and comprising:
an adaptive element, operative to process the estimated symbols responsive to the channel response; and
a fixed element, operative to process the estimated symbols responsive to the predetermined filter response,
the DFE generating feedback-equalized samples by combined operation of the adaptive and fixed elements; and
an adder, coupled to combine the forward-equalized samples with the feedback-equalized samples so as to provide the equalized samples to the decision device.

2. A receiver according to claim 1, and comprising a filter, which is coupled to apply the predetermined filter response to the signal.

3. A receiver according to claim 1, wherein the predetermined filter response is applied by a transmitter, which transmits the signal over the channel.

4. A receiver according to claim 1, wherein the predetermined filter response comprises a notch filter response.

5. A receiver according to claim 1, wherein the predetermined filter response is applied by a digital filter having an infinite impulse response, and wherein the fixed element of the DFE comprises an infinite impulse response filter element.

6. A receiver according to claim 1, wherein the adaptive element comprises:
a decision feedback filter having adaptive coefficients; and
an adaptation circuit, operative to determine the adaptive coefficients responsive to the predetermined filter response.

7. A receiver according to claim 6, wherein the adaptation circuit determines the adaptive coefficients based on filtering the estimated symbols using the predetermined filter response.

8. A receiver according to claim 7, wherein the adaptation circuit determines the adaptive coefficients using a least-mean-square method.

9. A receiver according to claim 1, wherein the adaptive element comprises:
a decision feedback filter having adaptive coefficients; and
an adaptation circuit, operative to determine the adaptive coefficients using least-mean-square method.

10. A receiver according to claim 1, wherein the predetermined filter response is described by a frequency response F(z), and
wherein the fixed element of the DFE comprises:
a first fixed element, having a frequency response substantially equal to F(z), which operates on the estimated symbols in conjunction with the adaptive element to generate a first output; and
a second fixed element, having a frequency response substantially equal to $(F(z)-1)/z^{-1}$, which operates on the estimated symbols to generate a second output, and
wherein the DFE comprises an adder, which sums the first and second outputs to generate the feedback-equalized samples.

11. A receiver according to claim 1, wherein the adaptive element comprises a decision feedback filter having adaptive coefficients, which are determined responsive to the channel response in an initial stage of operation of receiving the signal from a transmitter, and
wherein in a subsequent stage of receiving the signal, the adaptive coefficients are conveyed to a precoder in the transmitter that is operative to precode the signal using the coefficients.

12. A receiver according to claim 11, wherein in the subsequent stage of receiving the signal, the adaptive element of the DFE is substantially inoperative, while the fixed element continues to process the estimated symbols responsive to the predetermined filter response.

13. A method for decision feedback equalization, comprising:
generating a sequence of estimated symbols based on a corresponding sequence of equalized samples, which are derived from a signal that is transmitted over a channel having a channel response and is filtered with a predetermined filter response;
processing the estimated symbols with adaptive processing parameters responsive to the channel response so as to generate adaptive feedback samples;
processing the estimated symbols with fixed processing parameters responsive to the predetermined filter response so as to generate fixed feedback samples; and
combining the adaptive feedback samples with the fixed feedback samples so as to generate feedback-equalized samples, for use in deriving the equalized samples.

14. A method according to claim 13, wherein generating the sequence of estimated symbols comprises receiving the signal over the channel and filtering the received signal with the predetermined filter response.

15. A method according to claim 13, wherein generating the sequence of estimated symbols comprises receiving the signal, which was filtered with the predetermined filter response before being transmitted over the channel.

16. A method according to claim 13, wherein the predetermined filter response comprises a notch filter response.

17. A method according to claim 13, wherein the predetermined filter response comprises an infinite impulse response, and wherein processing the estimated symbols with the fixed processing parameters comprises applying an infinite impulse response filter to the estimated symbols.

18. A method according to claim 13, wherein combining the adaptive and fixed feedback samples so as to generate the equalized samples comprises combining the adaptive and fixed feedback samples with forward-equalized samples derived from the signal, so as to generate the equalized samples.

19. A method according to claim 13, wherein processing the estimated symbols with the adaptive processing parameters comprises applying a decision feedback equalizer having adaptive coefficients to the estimated symbols, and determining the adaptive coefficients responsive to the predetermined filter response.

20. A method according to claim 19, wherein determining the adaptive coefficients comprises determining the coefficients using a least-mean-square method.

21. A method according to claim 13, wherein the predetermined filter response is described by a frequency response F(z), and
wherein processing the estimated symbols with the adaptive processing parameters comprises filtering the estimated symbols with a frequency response substantially equal to F(z) in conjunction with applying the adaptive processing parameters, so as to generate the adaptive feedback samples, and
wherein processing the estimated symbols with the fixed processing parameters comprises filtering the estimated symbols with a frequency response substantially equal to $(F(z)-1)/z^{-1}$, so as to generate the fixed feedback samples, and wherein combining the adaptive feedback samples with the fixed feedback samples comprises summing the adaptive and fixed feedback samples.

22. A method according to claim 13, and comprising:

receiving the signal over the channel from a transmitter having a precoder, wherein processing the estimated symbols with the adaptive processing parameters comprises applying a decision feedback equalizer having adaptive coefficients to the estimated symbols, and determining the adaptive coefficients responsive to the channel response in an initial stage of receiving the signal from the transmitter; and in a subsequent stage of receiving the signal, conveying the adaptive coefficients to the precoder, wherein the precoder is operative to precode the signal using the coefficients.

23. A method according to claim 22, wherein processing the estimated symbols with the adaptive processing parameters comprises ceasing to process the estimated symbols with the adaptive processing parameters in the subsequent stage of receiving the signal, while continuing to process the estimated symbols with the fixed processing parameters responsive to the predetermined filter response.

* * * * *

UNITED STATES PATENT AND TRADEMARK OFFICE
CERTIFICATE OF CORRECTION

PATENT NO. : 6,751,255 B1
DATED : June 15, 2004
INVENTOR(S) : Ilan Reuven et al.

It is certified that error appears in the above-identified patent and that said Letters Patent is hereby corrected as shown below:

Title page,
Item [73], Assignee, please delete "Orckit Communications, Ltd." and substitute with -- Tioga Technologies --.

Signed and Sealed this

Seventh Day of June, 2005

JON W. DUDAS
*Director of the United States Patent and Trademark Office*